United States Patent
Komatsu et al.

(10) Patent No.: US 6,599,846 B2
(45) Date of Patent: Jul. 29, 2003

(54) METHOD OF FORMING A SILICA-CONTAINING COATING FILM WITH A LOW DIELECTRIC CONSTANT AND SEMICONDUCTOR SUBSTRATE COATED WITH SUCH A FILM

(75) Inventors: Michio Komatsu, Kitakyushu (JP); Akira Nakashima, Kitakyushu (JP); Miki Egami, Kitakyushu (JP); Ryo Muraguchi, Kitakyushu (JP)

(73) Assignee: Catalysts & Chemicals Industries Co., Ltd., Kanagawa (JP)

(*) Notice: Subject to any disclaimer, the term of this patent is extended or adjusted under 35 U.S.C. 154(b) by 0 days.

(21) Appl. No.: 09/914,418

(22) PCT Filed: Dec. 15, 2000

(86) PCT No.: PCT/JP00/08933
§ 371 (c)(1),
(2), (4) Date: Aug. 28, 2001

(87) PCT Pub. No.: WO01/48806
PCT Pub. Date: Jul. 5, 2001

(65) Prior Publication Data
US 2002/0187652 A1 Dec. 12, 2002

(30) Foreign Application Priority Data
Dec. 28, 1999 (JP) .......... 11-374682

(51) Int. Cl.$^7$ .......... H01L 21/31; H01L 21/469
(52) U.S. Cl. .......... 438/781; 438/778; 438/780; 438/782; 438/623
(58) Field of Search .......... 106/287.1; 257/642, 257/759; 438/778, 623, 780–781, 782

(56) References Cited

U.S. PATENT DOCUMENTS

| | | | |
|---|---|---|---|
| 4,075,391 A | * 2/1978 | Berg et al. | 428/407 |
| 4,363,706 A | * 12/1982 | Williams et al. | 205/588 |
| 4,965,092 A | * 10/1990 | Hayduk et al. | 427/96 |
| 5,153,295 A | * 10/1992 | Whitmarsh et al. | 528/31 |
| 5,413,952 A | * 5/1995 | Pages et al. | 438/406 |
| 5,602,060 A | 2/1997 | Kobayashi et al. | |
| 5,789,325 A | * 8/1998 | Chandra et al. | 438/781 |
| 6,214,746 B1 | * 4/2001 | Leung et al. | 438/780 |
| 6,214,748 B1 | * 4/2001 | Kobayashi et al. | 438/782 |
| 6,225,238 B1 | * 5/2001 | Wu | 438/778 |
| 6,261,357 B1 | * 7/2001 | Egami et al. | 106/287.1 |
| 6,372,666 B1 | * 4/2002 | Ramos et al. | 438/781 |

FOREIGN PATENT DOCUMENTS

| | | | |
|---|---|---|---|
| EP | 0417951 | * 3/1991 | H01F/10/14 |
| EP | 0869515 A1 | 10/1998 | |
| EP | 0890623 A1 | 1/1999 | |
| EP | 1035183 A1 | 6/2000 | |
| EP | 1026213 A1 | 8/2000 | |
| JP | 63-057755 | * 12/1988 | C23C/4/06 |
| JP | (1997) 315812 | 12/1997 | |
| WO | WO 00/12640 | 3/2000 | |
| WO | WO 00/18847 | 4/2000 | |

* cited by examiner

Primary Examiner—Phat A. Cao
Assistant Examiner—Thao X. Le
(74) Attorney, Agent, or Firm—Webb Ziesenheim Logsdon Orkin & Hanson, P.C.

(57) ABSTRACT

The present invention provides a method for forming a silica-containing film with a low-dielectric constant of 3 or less on a semiconductor substrate steadily, which comprises steps of (a) applying a coating liquid for forming the silica-containing film with the low-dielectric constant onto the semiconductor substrate, (b) heating the thus coated film at 50 to 350° C., and then (c) curing the thus treated film at 350 to 450° C. in an inert-gas atmosphere containing 500 to 15,000 ppm by volume of oxygen, and also provides a semiconductor substrate having a silica-containing film formed by the above method.

The above step (b) for the thermal treatment is preferably conducted at 150 to 350° C. for 1 to 3 minutes in an air atmosphere. Also, the above curing step (c) is preferably conducted by placing the semiconductor substrate on a hot plate kept at 350 to 450° C.

According to the present invention, a semiconductor substrate coated with a silica-containing film having characteristics of a low-dielectric constant of 3 or less, a low moisture adsorptivity and high film strength without causing any damage to the metal wiring arranged on the substrate, can be obtained steadily.

20 Claims, No Drawings

METHOD OF FORMING A SILICA-CONTAINING COATING FILM WITH A LOW DIELECTRIC CONSTANT AND SEMICONDUCTOR SUBSTRATE COATED WITH SUCH A FILM

FIELD OF THE INVENTION

The present invention relates to a method of steadily forming, on a semiconductor substrate, a silica-containing film having characteristics of a low-dielectric constant as low as 3 or less, a low moisture adsorptivity and high film strength without causing any damage to the metal wiring arranged on the substrate, and also relates to a semiconductor substrate coated with a silica-containing film having the above characteristics.

BACKGROUND OF THE INVENTION

In semiconductor devices with a multi-level integrated circuit designed at a rule of 0.25 micron or less, the metal wiring impedance attributed to electrostatic induction is increased because of the narrow spacing between metal wiring layers required for the advanced integration of such semiconductor devices. Thus, a delay in response speed and an increase in power consumption become problems to be solved. To cope with this, it is necessary to minimize the dielectric constant of an interconnect insulating film disposed between a semiconductor substrate and metal wiring layer such as an aluminum wiring layer or between metal wiring layers.

The interconnect insulating film disposed for the above purposes is generally formed on a substrate by a vapor phase growth method such as CVD method or by an ordinary coating method which uses a conventional coating liquid.

However, it is considered that the dielectric constant of the silica-containing film produced by the vapor phase growth method such as CVD method is limited to 3.5 (which is obtainable only in the case of the fluorine-doped silica-containing film), and that decreasing it to 3 or less is difficult. On the other hand, the coating film containing polyaryl resin, fluorinated polyimide resin or fluoro-resin, formed on a substrate by the CVD method or the ordinary coating method, exhibits the low-dielectric constant of around 2. However, the coating film containing such a resin has other types of drawbacks such as insufficient adhesion to the substrate or resist used for its fine processing, and poor resistance to chemicals and oxygen plasma.

The conventional coating liquid for forming a silica-containing film, which comprises hydrolyzate of alkoxysilane or halogenated silane and/or a partial hydrolyzate thereof, gives a coating film with the low-dielectric constant of around 2.5. However, there is a problem of the coating film insufficiently adhering to the substrate.

The inventors of the present invention have found, after extensive studies to solve the above problems, that each of the coating liquids described below gives a silica-containing film with the low-dielectric constant of 3 or less, and being excellent not only in adhesion to the substrate, mechanical strength, resistance to chemicals (e.g., alkali) and anti-cracking, but also in process suitability (e.g., resistance to oxygen plasma and etching processability). Based on such findings, they have filed several patent applications as follows:

(1) Invention 1 (Japanese Patent Laid-Open Publication No. 315812/1997)

A coating liquid comprising a reaction product between fine particles of silica, and alkoxysilane and/or halogenated silane or hydrolyzate thereof.

(2) Invention 2 (International Publication No. WO 00/18847)

A coating liquid comprising alkoxysilane and/or halogenated silane or hydrolyzate thereof, and a readily decomposable resin which decomposes or vaporizes at a temperature of 500° C. or lower.

(3) Invention 3 (International Publication No. WO 00/12640)

A coating liquid comprising polysiloxane as a reaction product between fine particles of silica, and alkoxysilane and/or halogenated silane or hydrolyzate thereof, and a readily decomposable resin which decomposes or vaporizes at a temperature of 500° C. or lower.

Thereafter, the inventors of the present invention have repeatedly conducted tests for forming a low-dielectric silica coating film from the above coating liquids on various semiconductor substrates by the ordinary film forming method, and then they have found that, although a coating film having the above characteristics can be obtained, metal wiring arranged on some types of the substrates may be damaged, and that it is difficult to stably form the coating film having excellent characteristics, that is, a low-dielectric constant of 3 or less, a low moisture adsorptivity and high film strength. Therefore, they have further continued the investigations to solve the above problems, and have found that such problems can be easily solved by forming a low-dielectric, silica-containing film on a semiconductor substrate under specific conditions as described below.

DETAILED DESCRIPTION OF THE INVENTION

The present invention has been accomplished with a view to solving the above problems of the prior art.

Accordingly, it is an objective of the present invention to provide a method of steadily forming, on a semiconductor substrate, a low-dielectric, silica-containing film having characteristics of a low-dielectric constant of 3 or less, a low moisture adsorptivity and high film strength without causing any damage to the metal wiring arranged on the substrate. It is another objective of the present invention to provide a semiconductor substrate coated with a silica-containing film having the above characteristics.

The method of the present invention for forming a silica-containing film with a low-dielectric constant of 3 or less steadily on a semiconductor substrate comprises steps of:

(a) applying a coating liquid for forming a silica-containing film with a low-dielectric constant onto a semiconductor substrate, (b) heating the thus coated film at 50 to 350° C., and then (c) curing the thus treated film at 350 to 450° C. in an inert-gas atmosphere containing 500 to 15,000 ppm by volume of oxygen.

The coating liquid for forming a silica-containing film with a low-dielectric constant preferably contains hydrolyzate of at least one silicon compound selected from the group consisting of alkoxysilanes and halogenated silanes represented by the following general formula (I) and (II), respectively:

$$X_n Si(OR)_{4-n} \qquad (I),$$
$$X_n SiX'_{4-n} \qquad (II),$$

wherein, X represents a hydrogen atom, fluorine atom, unfluorinated or fluorinated alkyl group of 1 to 8 carbon atoms, aryl group or vinyl group; R represents a hydrogen atom, alkyl group of 1 to 8 carbon atoms, aryl group or vinyl group; X' represents a halogen atom; and n is an integer of 0 to 3.

The coating liquid for forming a silica-containing film with a low-dielectric constant also preferably contains a compound of polysiloxane as a reaction product between fine particles of silica and hydrolyzate of at least one silicon compound selected from the group consisting of alkoxysilanes and halogenated silanes represented by the following general formula (I) and (II), respectively:

$$X_nSi(OR)_{4-n} \tag{I}$$

$$X_nSiX'_{4-n} \tag{II}$$

wherein, X represents a hydrogen atom, fluorine atom, an unfluorinated or fluorinated alkyl group of 1 to 8 carbon atoms, aryl group or vinyl group; R represents a hydrogen atom, alkyl group of 1 to 8 carbon atoms, aryl group or vinyl group; X' represents a halogen atom; and n is an integer of 0 to 3.

The coating liquid for forming a silica-containing film with a low-dielectric constant also preferably contains a readily decomposable resin having a number-average molecular weight of 500 to 50,000 in terms of polystyrene, and decomposing or vaporizing easily when thermally treated at a temperature of 450° C. or lower.

The readily decomposable resin is preferably constituted with a composition of an interpenetrated polymer in which the hydrolyzate of the silicon compound or polysiloxane and the readily decomposable resin are homogeneously entangled in each other on the molecular chain level.

The coating liquid for forming a silica-containing film with a low-dielectric constant preferably has the Si—H group at the terminal of any one of the hydrolyzate of the silicon compound, the polysiloxane and/or the interpenetrated polymer.

The thermal treatment step (b) as described above is preferably conducted at 150 to 350° C. for 1 to 3 minutes in an air atmosphere, especially by use of a dry air.

The curing step (c) as described above is preferably conducted in an inert-gas atmosphere containing 1,000 to 10,000 ppm by volume of oxygen.

The above curing step (c) is also preferably conducted by placing the semiconductor substrate on a hot plate kept at a temperature of 350 to 450° C.

On the other hand, the semiconductor substrate of the present invention is characterized in that it has the silica-containing film with a low-dielectric constant of 3 or less and other excellent characteristics as described herein, which is formed by use of the above specific method.

The method for forming a silica-containing film (i.e., a coating film) with a low-dielectric constant on a semiconductor substrate according to the present invention is described below in detail.

Coating Liquid for Forming a Silica-Containing Film With a Low-Dielectric Constant The method of the present invention can use some kinds of conventional coating liquids for forming a silica-containing film with a low-dielectric constant although depending on their properties, but preferably uses at least one of the following coating liquids (Coating Liquid-A, Coating Liquid-B and Coating Liquid-C) to form a silica-containing film with a low-dielectric constant on a semiconductor substrate.

(1) Coating Liquid-A

Coating Liquid-A contains a reaction product obtained by hydrolyzing or partial-hydrolyzing at least one silicon compound mixed with an organic solvent in the presence of a catalyst and water, wherein the silicon compound is selected from the group consisting of alkoxysilanes and halogenated silanes represented by the following general formula (I) and (II), respectively:

$$X_nSi(OR)_{4-n} \tag{I}$$

$$X_nSiX'_{4-n} \tag{II}$$

wherein, X represents a hydrogen atom, fluorine atom, fluorinated or unfluorinated alkyl group of 1 to 8 carbon atoms, aryl group or vinyl group; R represents a hydrogen atom, alkyl group of 1 to 8 carbon atoms, aryl group or vinyl group; x' represents a halogen atom; and n is an integer of 0 to 3.

Examples of the alkoxysilanes represented by the general formula (I) include methyltrimethoxysilane, methyltriethoxysilane, methyltriisopropoxysilane, ethyltrimethoxysilane, ethyltriethoxysilane, ethyltriisopropoxysilane, octyltrimethoxysilane, octyltriethoxysilane, vinyltrimethoxysilane, vinyltriethoxysilane, phenyltrimethoxysilane, phenyltriethoxysilane, trimethoxysilane, triethoxysilane, triisopropoxysilane, fluorotrimethoxysilane, fluorotriethoxysilane, dimethyldimethoxysilane, dimethyldiethoxysilane, diethyldimethoxysilane, diethyldiethoxysilane, dimethoxysilane, diethoxysilane, difluorodimethoxysilane, difluorodiethoxysilane, trifluoromethyltrimethoxysilane, and trifluoromethyltriethoxysilane.

Examples of the halogenated silanes represented by the general formula (II) include trichlorosilane, tribromosilane, dichlorosilane, fluorotrichlorosilane, fluorobromosilane, methyltrichlorosilane, ethyltrichlorosilane, phenyltrichlorosilane, and vinyltrichlorosilane.

As for the organic solvents, alcohols, ketones, ethers, esters and hydrocarbons, for example, can be used. More concretely, they include alcohols, e.g., methanol, ethanol, propanol and butanol; ketones, e.g., methylethylketone and methylisobutylketone; glycol ethers, e.g., methylcellosolve, ethylcellosolve and propyleneglycol-monopropylether; glycols, e.g., ethylene glycol, propylene glycol and hexylene glycol; esters, e.g., methyl acetate, ethyl acetate, methyl lactate and ethyl lactate; hydrocarbons, e.g., hexane, cyclohexane and octane; and aromatic hydrocarbons, e.g., toluene, xylene and mesitylene.

The catalysts include inorganic acids, e.g., hydrochloric, nitric and sulfuric acid; organic acid, e.g., acetic, oxalic and toluenesulfonic acid; and compounds exhibiting acidity in an aqueous solution, e.g., metallic soap.

Water, which is necessary for the hydrolysis reaction of alkoxysilane or halogenated silane, is added in an amount of 0.1 to 5 mols, preferably 0.1 to 2 mols, per mol of the Si—OR group which constitutes the alkoxysilane or the Si—X' group which constitutes the halogenated silane. The catalyst is normally added in an amount of 0.001 to 1 mol per mol of the alkoxysilane or halogenated silane.

The hydrolysis reaction of alkoxysilane is performed normally at a temperature of 80° C. or lower, preferably 5 to 60° C. under agitation for 10 hours or less, preferably 0.5 to 5 hours. The hydrolysis reaction of halogenated silane is normally performed at a temperature of 50° C. or lower, preferably 5 to 20° C. under agitation for a period of 20 hours or less, preferably 1 to 10 hours. When the alkoxysilane and halogenated silane are simultaneously hydrolyzed, the above conditions for the halogenated silane are preferable to be selected.

Thus obtained hydrolyzate or partial hydrolyzate desirably has a number-average molecular weight, in terms of polystyrene, of 500 to 10,000, preferably 1,000 to 5,000.

(2) Coating Liquid-B

Coating Liquid-B contains a compound of polysiloxane as a reaction product between fine particles of silica and hydrolyzate of at least one silicon compound selected from the group consisting of alkoxysilanes and halogenated silanes represented by the above formula (I) and (II). The fine particles of silica are obtained by mixing at least one of the alkoxysilanes represented by the formula (I) with an organic solvent, and then hydrolyzing and polycondensing the alkoxysilane in the presence of water and ammonia. The polysiloxane is obtained by mixing the fine particles of silica and at least one of a silicon compound selected from the group consisting of alkoxysilanes and halogenated silanes represented by the above formula (I) and (II) with an organic solvent, and then hydrolyzing them in the presence of water and catalyst.

The detailed methods of preparing the polysiloxane are described in the patent specifications of Invention 1 (Japanese Patent Laid-Open Publication No. 315812/1997) and Invention 3 (WO00/12640).

(3) Coating Liquid-C

Coating Liquid-C contains, in addition to the hydrolyzate or partial hydrolyzate for Coating Liquid-A or the polysiloxane for Coating Liquid-B, a readily decomposable resin.

The readily decomposable resin used in the present invention has a number-average molecular weight of 500 to 50,000 in terms of polystyrene, and decomposes or vaporizes by thermal treatment at a temperature of 450° C. or lower.

Examples of the suitable readily decomposable resins include cellulose-resins, polyamide-resins, polyester-resins, acrylic-resins, polyether-resins, polyolefin-resins, polyol-resins and epoxy-resins.

The number-average molecular weight of these readily decomposable resins is in the range of 500 to 50,000, preferably 5,000 to 30,000 in terms of polystyrene.

In Coating Liquid-C, the readily decomposable resin is preferably constituted with a composition of an interpenetrated polymer in which the hydrolyzate of the silicon compound or polysiloxane and the readily decomposable resin are homogeneously entangled in each other on the molecular chain level. This interpenetrated polymer composition also has a number-average molecular weight, in terms of polystyrene, of 500 to 50,000, preferably 1,000 to 30,000.

The detailed methods of preparing the interpenetrated polymer composition are described in the patent specifications of Invention 2 (WO00/18847) and Invention 3 (WO00/12640).

The coating liquids suitably used in the present invention include Coating Liquids A to C as described above. Furthermore, they preferably have the Si—H group at the terminal of the hydrolyzate of the silicon compound, the polysiloxane and/or the interpenetrated polymer.

The Si—H group is oxidized, when the coated film is cured in a specific gas atmosphere in the present invention (e.g., in an atmosphere of nitrogen gas containing some amount of oxygen), by the presence of a small but adequate quantity of oxygen (e.g., 500 to 15,000 ppm by volume), in the following order:

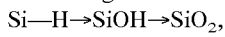

where it is likely to form the networks of —Si—O—Si—O— in the cured film.

The silica-containing film with a low-dielectric constant of 3 or less, a low moisture adsorptivity and high film strength can be easily formed, when any one of Coating Liquids A to C is used.

The above coating liquid of the present invention preferably contains solid components such as the hydrolyzate of the silicon compound, the polysiloxane, the readily decomposable resin, and/or the interpenetrated polymer at a concentration of 5 to 30% by weight, more preferably 10 to 25% by weight in an organic solvent.

The organic solvents may be selected from the group consisting of alcohols, glycol ethers, ketones, other types of ethers, esters, and hydrocarbons including aromatic hydrocarbons.

The solution containing the solid components, prepared by the above method, may be directly used as the coating liquid in the present invention. However, it is preferable that the organic phase in the solution is separated and then replaced with another solvent such as methyl-isobutyl-ketone and propylene-glycol-monopropyl-ether, by means of a rotary evaporator or the like, whereby the alcohol (including a by-product of the hydrolysis reaction), water and catalyst dissolved therein can be completely removed from the original solution, and the solid content of the new solution can be easily adjusted as described above.

Method of Forming a Silica-Containing Film With a Low-Dielectric Constant on a Semiconductor Substrate The method of the present invention for forming a silica-containing film with a low-dielectric constant of 3 or less steadily on a semiconductor substrate comprises steps of:

(a) applying a coating liquid for forming a silica-containing film with a low-dielectric constant onto a semiconductor substrate, (b) heating the thus coated film at 50 to 350° C., and then (c) curing the thus treated film at 350 to 450° C. in an inert-gas atmosphere containing 500 to 15,000 ppm by volume of oxygen.

Further details of the above steps (a) to (c) are as described below.

(a) Coating Step

The coating liquid as described above can be applied onto the semiconductor substrate by the use of any customary techniques, such as spraying, spin coating, dip coating, roll coating or transfer printing, for forming a film coated thereon (i.e., a coated film).

(b) Thermal Treatment Step

The coated film formed on the semiconductor substrate by the above step (a) is then heated at a temperature of 50 to 350° C., preferably 150 to 350° C. The temperature for the thermal treatment is adequately selected from the level sufficiently high but lower than 350° C. to vaporize the organic solvent contained in the coated film. Heating the coated film at a temperature of not higher than 350° C. is undesirable, because it will cause rapid evaporation of the organic solvent contained in the film, and also rapid decomposition or evaporation of the readily decomposable resin. Time for the thermal treatment is 5 minutes or shorter, preferably 1 to 3 minutes, although varying depending on the film thickness and other properties.

The thermal treatment step (b) may be conducted under a uniform condition, e.g., (i) at 150° C. for 3 minutes or (ii) at 250° C. for 3 minutes, or may be conducted with different temperatures increased stepwise, e.g., (iii) at 150° C. for 1 minute, 250° C. for 1 minute and 350° C. for 1 minute (i.e., step baking method).

The step baking method as described above (iii) causes the organic solvent contained in the coated film to vaporize slowly, thereby making the film thickness more uniform. It has another advantage of slowly decomposing or evaporating part of the readily decomposable resin, when it is contained in the coated film. However, it tends to cause the coating film formed on the semiconductor substrate to have a slightly higher dielectric constant than that obtained from the above method (i) which is effected at a relatively low temperature.

The thermal treatment step may be conducted in an inert-gas atmosphere such as nitrogen gas, as used in the conventional manner. However, the thermal treatment step (b) in the present invention is preferably conducted in an air atmosphere, especially by using of a dry air. Because the film is treated at a relatively low temperature for such a short time as described above, the metal wiring on the semiconductor substrate will not be damaged, for instance, by oxidation of the metal component, even if it is exposed to an air atmosphere containing oxygen at a relatively high proportion. Thus, the thermal treatment in the present invention can save the consumption of expensive nitrogen gas. And then the thermal treatment enables a trace quantity of oxygen to be easily incorporated into the coated film, which results in helping formation of $SiO_2$ in the subsequent curing treatment step (c) as described above and in easily forming a low-dielectric, silica-containing film having a low moisture adsorptivity and high film strength.

The thermal treatment leads to the vaporization of the organic solvent contained in the coated film; the moderate curing of the solid components contained in the film by their polymerization and polycondensation being in progress; the lowering of the melt viscosity of the resultant polymer components; and the improvement of its re-flow property. As a result, a coating film with a highly enhanced planarity can be obtained.

Although it varies depending on the substance to be coated and its target, the thickness of the silica-containing film with a low-dielectric constant formed in the above manner generally ranges from about 1,000 to 2,500 Å when forming on a silicon wafer of a semiconductor device and generally ranges from 1,000 to 10,000 Å when forming between wiring layers of a multi-level interconnect.

(c) Curing Treatment Step

The thermally treated film as described above is then subjected to the curing treatment step (c) to be carried out at the temperature of 350 to 450° C., preferably 375 to 425° C. in an inert-gas atmosphere containing 500 to 15,000 ppm, preferably 1,000 to 10,000 ppm by volume of oxygen.

As the inert gas, nitrogen gas is preferably used. In the present invention, the inert gas is used with addition of oxygen gas or air (dry air) in an adequate quantity. The oxygen content of the inert gas is carefully adjusted in the range of 500 to 15,000 ppm by volume.

If the oxygen content is not more than 500 ppm by volume, the cured coating film may not have sufficient mechanical strength, which results in a poor practicality of the semiconductor substrate having such a film. It is likely that this is due to insufficient formation of the —O—Si—O—Si— networks in the cured film treated under a condition of such an atmosphere.

On the other hand, if the oxygen content is not less than 15,000 ppm by volume, the metal wiring arranged on the semiconductor substrate may be easily damaged by oxidation of the metal component in the process of the curing treatment step (c), which results in decreasing the yield of final products of the semiconductor substrate.

The curing temperature varies depending on the properties of the silicon compound contained in the coating liquid as described above, but is selected from a range of the temperatures from 350 to 450° C. For the coating liquid containing the above readily decomposable resin, the curing step (c) is preferably conducted at a higher temperature than that of which the resin is readily decomposed or vaporized. By such a treatment, a low-density silica-containing film with a low-dielectric constant and essentially containing no pores or voids of more than 10 nm (100 Å) in diameter can be obtained.

Time for the curing treatment is desirably 10 to 60 minutes, although depending on, for example, type of the coating liquid and thickness of the coating film.

If the curing temperature is not higher than 350° C., the coating film may not have a sufficient mechanical strength because of insufficient formation of the —O—Si—O—Si— networks in the cured film. On the other hand, if the curing temperature is not lower than 450° C., the metal wiring made of aluminum or copper may be oxidized or melted when the coating film is cured, thereby damaging the metal wiring arranged on the semiconductor substrate. Therefore, the curing temperature is to be in the range of 350 to 450° C.

In the ordinary methods, the curing treatment step has been conducted normally in the atmosphere of an inert gas essentially consisting of nitrogen gas, or in the atmosphere of an inert gas containing a relatively high proportion of oxygen, e.g., 5% by volume. However, the inventors of the present invention have found that the curing treatment done under the above conditions stably gives, in high yield, the semiconductor substrate with a silica-containing film having the above characteristics.

This curing treatment step (c) may be conducted in a known vertical or horizontal furnace, which can simultaneously treat a number of the semiconductor substrates, because the inert gas (e.g., nitrogen) with a given amount of oxygen, which was adjusted in advance by addition of oxygen gas or air (dry air) thereto, is fed continuously into the furnace. However, it is essential in the present invention to control the oxygen content of the inert gas in the above range, and the coating film is preferably cured on a hot plate of a leaf-type curing unit with an upper lid. In addition, the unit for the curing treatment is preferably equipped with cooling means (e.g., cooling plate) to cool the cured film before it is taken out of the unit, in order to prevent the hot film from being exposed to the air atmosphere of higher oxygen content.

Semiconductor Substrate With a Silica-Containing Film With a Low-Dielectric Constant The semiconductor substrate having a silica-containing film with a low-dielectric constant in the present invention is one of the parts for a semiconductor device, at which the coating film is formed by the above specific method on a silicon wafer, a part between wiring layers of a multi-level interconnect, an element surface and/or a part of PN junction.

The coating film formed on the semiconductor substrate by the above method of the present invention has a low-dielectric constant of 3 or less, and is not only excellent in the adhesion to the substrate, resistance to chemicals (e.g., alkali), anti-cracking, and process suitability (e.g., in the resistance to oxygen plasma and etching processability), but also in the low moisture adsorptivity and high film strength.

Accordingly, in the present invention the semiconductor substrate having the silica-containing film with the excellent characteristics as described above is steadily obtained without causing any damage to the metal wiring arranged on the substrate.

EXAMPLES

The present invention is now illustrated with reference to the following Examples, but such examples in no way limit the scope of the invention.

Production Example 1

Preparation of Coating Liquid (1)

A mixed solution (250 g in total) consisting of (i) 66.67 g of triethoxysilane (manufactured by Shinetsu Chemical Industry Co., Ltd.) and (ii) 183.33 g of ethanol was prepared and then maintained at the temperature of around 20° C. To this solution, 21.82 g of an aqueous solution of nitric acid (as a catalyst) with a concentration of 0.05 by weight was added at once, and a hydrolysis reaction of triethoxysilane was performed at the temperature of around 20° C. for about 1 hour with agitating at 150 rpm. Thereafter, a 10-fold amount of methylisobutylketone (MIBK) was added thereto, and then a solvent was replaced to MIBK by means of a rotary evaporator to completely remove the alcohols (consisting of the ethanol added and the alcohol as a by-product of the hydrolysis reaction) and water (including nitric acid) contained therein. Thus, an MIBK solution containing the hydrolyzate of triethoxysilane with a concentration of 20% by weight in terms of $SiO_2$ was obtained.

Then, 125 g of the thus obtained MIBK solution was mixed with a solution obtained by dissolving 25 g of an acrylic resin in 100 g of MIBK, to obtain 250 g of a coating liquid (1) for forming a silica-containing film. The number-average molecular weight, in terms of polystyrene, of the acrylic resin was 22,190.

Production Example 2

Preparation of Coating Liquid (2)

A mixed solution (500 g in total) consisting of (i) 20.0 g of triethoxysilane, (ii) 39.77 g of methyltrimethoxysilane (both manufactured by Shinetu Chemical Industry Co., Ltd.) and (iii) 440.23 g of ethanol, was prepared and then maintained at the temperature of around 20° C. To this solution, 45 g of a 0.05 wt. % aqueous solution of nitric acid (as a catalyst) was added at once, and a hydrolysis reaction of triethoxysilane and methyltrimethoxysilane was performed at the temperature of around 20° C. for about 1 hour with agitating at 150 rpm. Thereafter, a 10-fold amount of methylisobutylketone (MIBK) was added thereto, and then a solvent was replaced to MIBK by means of a rotary evaporator to completely remove the alcohols (consisting of the ethanol added and the alcohol as a by-product of the hydrolysis reaction) and water (including nitric acid) contained therein. Thus, an MIBK solution containing the hydrolyzate of triethoxysilane and methyltrimethoxysilane with a total concentration of 20% by weight in terms of $SiO_2$ was obtained.

Then, 125 g of the thus obtained MIBK solution was mixed with a solution obtained by dissolving 3.75 g of an acrylic resin in 15 g of MIBK, to obtain a coating liquid (2) for forming a silica-containing film. The number-average molecular weight, in terms of polystyrene, of the acrylic resin was 22,190.

Examples 1 to 7

Semiconductor Substrates Coated with the Silica-Containing Film

By a spin coating, test pieces of a silicon wafer with 8-inch size (i.e., semiconductor substrate) were coated with Coating Liquid (2) for forming a coating film, prepared by the method of the above Production Example 2.

Each of these substrates coated thereon was subjected to the thermal treatment step (b) at which it was heated at a temperature of around 150° C. for 3 minutes in an air atmosphere using a dry air. The gases released out of the film (including the vaporized organic solvent) were discharged from the system.

Then, each of the substrates thermally treated was placed one by one on a hot plate of a leaf-type curing unit with an upper lid (i.e., ACT-8, manufactured by Tokyo Electron Co., Ltd), and cured in an inert-gas atmosphere (i.e., nitrogen gas with addition of oxygen) having an oxygen content as shown in Table 1 at a temperature level as also shown in Table 1 for 30 minutes, to form a silica-containing film (i.e., a coating film) with a low-dielectric constant as shown in Table 2. Then, it was cooled down to near room temperature, and taken out of the unit.

Each of the coating films was formed on the substrates with a thickness of around 5,000 Å.

For evaluating these coating films thus obtained, each of them was subjected to the following measurements:

(a) dielectric constant to be measured by a mercury probe method for which a frequency of 1 MHz is used, (b) the difference between the amounts of moisture adsorption into the film, to be measured by a TDS (thermal desorption mass-spectroscopy) method, before and after the film was subjected to an irradiation of oxygen plasma, (c) film strength (i.e., mechanical strength) to be measured by Sebastian strength tester, and (d) presence or absence of damaged metal wiring on the substrate, to be determined by a change of the wiring resistance measured by a tester. The results are given in Table 2.

Example 8

Semiconductor Substrate Coated with the Silica-Containing Film

By a spin coating, a test piece of a silicon wafer with 8-inch size (i.e., semiconductor substrate) was coated with Coating Liquid (2) for forming a coating film, prepared by the method of the above Production Example 2.

The coated substrate was subjected to the thermal treatment step (b) at which it was heated at a temperature of around 150° C. for 3 minutes in a nitrogen gas atmosphere. The gases released out of the film (including the vaporized organic solvent) were discharged from the system.

Then, the thermally treated substrate was placed on a hot plate of a leaf-type curing unit with an upper lid (i.e., ACT-8, manufactured by Tokyo Electron Co. Ltd.), and cured in an inert-gas atmosphere (nitrogen gas with addition of oxygen) having an oxygen content as shown in Table 1 at a temperature level as also shown in Table 1 for 30 minutes, to form a silica-containing film, in the same manner as in Examples 1 to 7. Then, it was cooled down to near room temperature, and taken out of the unit.

The coating film was formed on the substrate with a thickness of around 5,000 Å.

For making evaluation of the coating film thus obtained, it was subjected to the measurements for (a) a dielectric constant, (b) a difference between the amounts of moisture adsorption before and after irradiation of oxygen plasma, (c) film strength, and (d) presence or absence of damaged metal wiring, in the same manner as in Examples 1 to 7.

The results are also given in Table 2.

Examples 9 to 10

Semiconductor Substrates Coated with the Silica-Containing Film

By a spin coating, test pieces of a silicon wafer with 8-inch size (i.e., semiconductor substrate) were coated with Coating Liquid (1) for forming a coating film, prepared by the method of the above Production Example 1.

Each of the substrates coated thereon was subjected to the thermal treatment step (b) at which it was heated at a temperature of around 150° C. for 3 minutes in an air atmosphere using a dry air. The gases released out of the film (including the vaporized organic solvent) were discharged from the system.

Then, each of the substrates thermally treated was placed one by one on a hot plate of a leaf-type curing unit with an upper lid (i.e., ACT-8, manufactured by Tokyo Electron Co. Ltd), and cured in an inert-gas atmosphere (nitrogen gas with addition of oxygen) having an oxygen content as shown in Table 1 at a temperature level as also shown in Table 1 for 30 minutes, to form a silica-containing film, in the same manner as in Examples 1 to 7. Then, it was cooled down to near room temperature, and taken out of the unit.

Each of the coating films was formed on the substrates with a thickness of around 5,000 Å.

For making evaluation of the coating film thus obtained, it was subjected to the measurements for (a) a dielectric constant, (b) a difference between the amounts of moisture adsorption before and after irradiation of oxygen plasma, (c) film strength, and (d) presence or absence of damaged metal wiring, in the same manner as in Examples 1 to 7.

The results are also given in Table 2.

Comparative Examples 1 to 5

Semiconductor Substrates Coated with the Silica-Containing Film

By a spin coating, test pieces of a silicon wafer with 8-inch size (i.e., semiconductor substrate) were coated with Coating Liquid (2) for forming a coating film, prepared by the method of the above Production Example 2, in each comparative example.

Each of the substrates coated thereon was subjected to the thermal treatment step (b) at which it was heated at a temperature of around 150° C. for 3 minutes in an air atmosphere using a dry air. The gases released out of the film (including the vaporized organic solvent) were discharged from the system.

Then, each of the substrates thermally treated was placed one by one on a hot plate of a leaf-type curing unit with an upper lid (i.e., ACT-8, manufactured by Tokyo Electron Co. Ltd), and cured in an inert-gas atmosphere (nitrogen gas with addition of oxygen) having an oxygen content as shown in Table 1 at a temperature level as also shown in Table 1 for 30 minutes, to form a silica-containing film, in the same manner as in Examples 1 to 7. Then, it was cooled down to near room temperature, and taken out of the unit.

Each of the coating films was formed on the substrates with a thickness of around 5,000 Å.

For making evaluation of the coating films thus obtained, it was subjected to the measurements for (a) a dielectric constant, (b) a difference between the amounts of moisture adsorption before and after irradiation of oxygen plasma, (c) film strength, and (d) presence or absence of damaged metal wiring, in the same manner as in Examples 1 to 7.

The results are also given in Table 2.

TABLE 1

|  | Thermal treatment atmosphere | Oxygen content of the curing treatment atmosphere (ppm by volume) | Temperature of the curing treatment (° C.) |
| --- | --- | --- | --- |
| Example 1 | Air | 600 | 400 |
| Example 2 | Air | 1000 | 400 |
| Example 3 | Air | 3000 | 400 |
| Example 4 | Air | 5000 | 400 |
| Example 5 | Air | 7000 | 400 |
| Example 6 | Air | 10000 | 400 |
| Example 7 | Air | 14000 | 400 |
| Example 8 | Nitrogen | 5000 | 400 |
| Example 9 | Air | 600 | 400 |
| Example 10 | Air | 900 | 400 |
| Comp. Ex. 1 | Air | 10 | 400 |
| Comp. Ex. 2 | Air | 400 | 400 |
| Comp. Ex. 3 | Air | 5000 | 300 |
| Camp. Ex. 4 | Air | 5000 | 500 |
| Comp. Ex. 5 | Air | 16000 | 400 |

TABLE 2

|  | Dielectric constant of the coating film | Amount of moisture adsorption into the film | Sebastian film strength (Mpa) | Presence or abence of the damaged metal wiring |
| --- | --- | --- | --- | --- |
| Example 1 | 2.2 | Small | 51 | No |
| Example 2 | 2.2 | Small | 53 | No |
| Example 3 | 2.2 | Small | 56 | No |
| Example 4 | 2.2 | Small | 68 | No |
| Example 5 | 2.2 | Small | 70 or more | No |
| Example 6 | 2.2 | Small | 70 or more | No |
| Example 7 | 2.2 | Small | 70 or more | No |
| Example 8 | 2.2 | Small | 52 | No |
| Example 9 | 2.2 | Small | 68 | No |
| Example 10 | 2.2 | Small | 70 or more | No |
| Comp. Ex. 1 | 2.2 | Small | 19 | No |
| Comp. Ex. 2 | 2.2 | Small | 32 | No |
| Comp. Ex. 3 | 2.2 | Small | 28 | No |
| Comp. Ex. 4 | 2.8 | Large | 70 or more | Yes |
| Comp. Ex. 5 | 2.3 | Small | 70 or more | Yes |

As shown in Table 2, the method of the present invention formed a silica-containing film on a semiconductor substrate, having a low-dielectric constant of 3 or less and high film strength of 50 MPa or more, without causing any damage to the metal wiring arranged on the substrate. Each of the coating films in Examples 1 to 10 indicated having a small amount of moisture adsorption and a difference between the amounts of the moisture adsorption into the film, which were measured before and after it was subjected to an irradiation of oxygen plasma, was also very small.

By contrast, each of the coating films in Comparative Examples 1 and 2, which were cured in an inert-gas atmosphere containing oxygen of not more than 500 ppm by volume, indicated a low film strength (Sebastian film strength), although having a low-dielectric constant of 3 or less. Whilst, the coating film in Comparative Example 5, which was cured in an inert-gas atmosphere containing oxygen of not less than 15,000 ppm by volume, indicated some damages to the metal wiring arranged on the substrate, which might be caused by oxidation of its metal component.

Furthermore, the coating film in Comparative Example 3, which was cured at a temperature of not higher than 350° C., indicated a low film strength, and the coating film in Comparative Example 4, which was cured at a temperature of not lower than 450° C., indicated some damages to the metal wiring arranged on the substrate.

In addition, the coating film in Example 8, which was thermally treated in a nitrogen gas atmosphere at the thermal treatment step (instead of an air atmosphere), indicated a somewhat lower film strength than those of the coating films thermally treated in an air atmosphere using a dry air.

From the above results, it has become clear that according to the method of the present invention a semiconductor substrate coated with a silica-containing film having characteristics of a low-dielectric constant of 3 or less, a low moisture adsorptivity and high film strength without causing any damage to the metal wiring arranged on the substrate, can be obtained steadily.

As shown in Table 2, the curing treatment step in each of Examples 1 to 10, which was preformed in an inert gas atmosphere containing oxygen of 500 ppm by volume or more (but no more than 15,000 ppm by volume), can lead the formation of the coating film having a low dielectric constant of 3 or less and high film strength of 50 MPa or more. However, the coating film in Comparative Example 1, which was cured in the inert gas atmosphere containing oxygen of 10 ppm by volume, indicated a low film strength that cannot by used commercially, although the value of the dielectric constant was almost the same as those of the films prepared in Examples 1 to 8.

Therefore, the silica-containing films (i.e., a cured coating film) prepared in Examples 2, 4, 6 and 7, and in Comparative Example 1 were analyzed by the $^{29}$Si-NMR (nuclear magnetic resonance) method to determine contents of the following three components, represented by the formulae [I] to [III], and a rate of the peak area for each component:

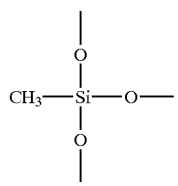

[I]

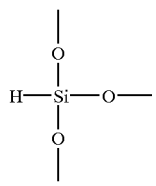

[II]

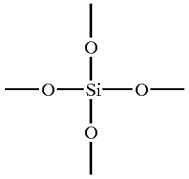

[III]

The results are given in Table 3.

TABLE 3

| | Dielectric constant | Rate of NMR-determined peak area (%) | | |
| --- | --- | --- | --- | --- |
| | | Chemical formula [I] | Chemical formula [II] | Chemical Formula [III] |
| Example 2 | 2.2 | 32.8 | 24.1 | 43.1 |
| Example 4 | 2.2 | 31.1 | 23.3 | 45.6 |
| Example 6 | 2.2 | 30.7 | 22.1 | 47.2 |
| Example 7 | 2.2 | 29.6 | 23.1 | 47.3 |
| Comp. Ex. 1 | 2.2 | 33.7 | 33.8 | 32.5 |

As shown in Table 3, it has been discovered that the component of the above chemical formula [III] in each of the coating films prepared in Examples 2, 4, 6 and 7 is included with the content of approximately 10% higher than that of the coating film prepared in Comparative Example 1, on a rate of the peak area for the component.

Moreover, it has been identified that the component of the above chemical formula [II] contained therein is likely to be easily converted into the component of the above chemical formula [III], when the film is cured in an inert-gas atmosphere containing oxygen of more than 500 ppm by volume and also at a temperature of more than 350° C.

From these findings, it has become clear that according to the method of the present invention a low-dielectric, silica-containing film having high film strength can be formed easily, because the crosslinking of the —Si—O—Si—O— networks is accelerated.

What is claimed is:

1. A method of forming a silica-containing film with a low-dielectric constant of 3 or less on a semiconductor substrate steadily, comprising steps of:

(a) applying a coating liquid for forming the silica-containing film with the dielectric constant onto the semiconductor substrate, (b) heating the thus coated film at 50 to 350° C., and then (c) curing the thus treated film at 350 to 450° C. in an inert-gas atmosphere containing 500 to 15,000 ppm by volume of oxygen.

2. The method of forming the silica-containing film on the semiconductor substrate as claimed in claim 1, wherein the coating liquid contains hydrolyzate of at least one silicon compound selected from the group consisting of alkoxysilanes and halogenated silanes represented by the following general formula (I) and (II), respectively:

$X_nSi(OR)_{4-n}$ (I), $X_nSiX'_{4-n}$ (II), wherein, X represents a hydrogen atom, fluorine atom, unfluorinated or fluorinated alkyl group of 1 to 8 carbon atoms, aryl group or vinyl group; R represents a hydrogen atom, alkyl group of 1 to 8 carbon atoms, aryl group or vinyl group; X' represents a halogen atom; and n is an integer of 0 to 3.

3. The method of forming the silica-containing film on the semiconductor substrate as claimed in claim 1, wherein the coating liquid contains a compound of polysiloxane as a reaction product between fine particles of silica and hydrolyzate of at least one silicon compound selected from the group consisting of alkoxysilanes and halogenated silanes represented by the following general formula (I) and (II), respectively:

$$X_n Si(OR)_{4-n} \quad (I),$$

$$X_n SiX'_{4-n} \quad (II),$$

wherein, X represents a hydrogen atom, fluorine atom, unfluorinated or fluorinated alkyl group of 1 to 8 carbon atoms, aryl group or vinyl group; R represents a hydrogen atom, alkyl group of 1 to 8 carbon atoms, aryl group or vinyl group; X' represents a halogen atom; and n is an integer of 0 to 3.

4. The method of forming the silica-containing film on the semiconductor substrate as claimed in claim 2, wherein the coating liquid contains a readily decomposable resin having a number-average molecular weight of 500 to 50,000 in terms of polystyrene and decomposing or vaporizing when thermally treated at a temperature of 450° C. or lower.

5. The method of forming the silica-containing film on the semiconductor substrate as claimed in claim 4, wherein the readily decomposable resin constitutes the composition of the interpenetrated polymer in which the hydrolyzate of the silicon compound or the polysiloxane, and the readily decomposable resin homogeneously entangled in each other on the molecular chain level.

6. The method of forming the silica-containing film on the semiconductor substrate as claimed in claim 1, wherein the coating liquid has the Si—H group at the terminal of any one of the hydrolyzate of the silicon compound, the polysiloxane and/or the interpenetrated polymer.

7. The method of forming the silica-containing film on the semiconductor substrate as claimed in claim 1, wherein the step (b) for the thermal treatment is conducted at 150 to 350° C for 1 to 3 minutes in an air atmosphere.

8. The method of forming the silica-containing film on the semiconductor substrate as claimed in claim 1, wherein the curing step (c) is conducted in an inert-gas atmosphere containing 1,000 to 10,000 ppm by volume of oxygen.

9. The method of forming the silica-containing film on the semiconductor substrate as claimed in claim 1, wherein the curing step (c) is conducted by placing the semiconductor substrate on a hot plate kept at 350 to 450° C.

10. A semiconductor substrate having the silica-containing film with the low-dielectric constant as low as 3 or less, formed by the method as claimed in claim 1.

11. The method of forming the silica-containing film on the semiconductor substrate as claimed in claim 3, wherein the coating liquid contains a readily decomposable resin having a number-average molecular weight of 500 to 50,000 in terms of polystyrene and decomposing or vaporizing when thermally treated at a temperature of 450° C. or lower.

12. The method of forming the silica-containing film on the semiconductor substrate as claimed in claim 11, wherein the readily decomposable resin constitutes the composition of the interpenetrated polymer in which the hydrolyzate of the silicon compound or the polysiloxane, and the readily decomposable resin homogeneously entangled in each other on the molecular chain level.

13. The method of forming the silica-containing film on the semiconductor substrate as claimed in claim 2, wherein the coating liquid has the Si—H group at the terminal of any one of the hydrolyzate of the silicon compound, the polysiloxane and/or the interpenetrated polymer.

14. The method of forming the silica-containing film on the semiconductor substrate as claimed in claim 3, wherein the coating liquid has the Si—H group at the terminal of any one of the hydrolyzate of the silicon compound, the polysiloxane and/or the interpenetrated polymer.

15. The method of forming the silica-containing film on the semiconductor substrate as claimed in claim 2, wherein the step (b) for the thermal treatment is conducted at 150 to 350° C. for 1 to 3 minutes in an air atmosphere.

16. The method of forming the silica-containing film on the semiconductor substrate as claimed in claim 3, wherein the step (b) for the thermal treatment is conducted at 150 to 350° C. for 1 to 3 minutes in an air atmosphere.

17. The method of forming the silica-containing film on the semiconductor substrate as claimed in claim 2, wherein the curing step (c) is conducted in an inert-gas atmosphere containing 1,000 to 10,000 ppm by volume of oxygen.

18. The method of forming the silica-containing film on the semiconductor substrate as claimed in claim 3, wherein the curing step (c) is conducted in an inert-gas atmosphere containing 1,000 to 10,000 ppm by volume of oxygen.

19. The method of forming the silica-containing film on the semiconductor substrate as claimed in claim 2, wherein the curing step (c) is conducted by placing the semiconductor substrate on a hot plate kept at 350 to 450° C.

20. The method of forming the silica-containing film on the semiconductor substrate as claimed in claim 3, wherein the curing step (c) is conducted by placing the semiconductor substrate on a hot plate kept at 350 to 450° C.

* * * * *